United States Patent
Nakamura

(10) Patent No.: US 6,184,808 B1
(45) Date of Patent: Feb. 6, 2001

(54) PARALLEL-TO-PARALLEL CONVERTER INCLUDING COMMON MULTIPLE REGISTER

(75) Inventor: Kazuyuki Nakamura, Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/159,392

(22) Filed: Sep. 23, 1998

(30) Foreign Application Priority Data

Sep. 24, 1997 (JP) .................................................. 9-258025

(51) Int. Cl.[7] .................................................. H03M 7/00
(52) U.S. Cl. .............................. 341/95; 341/100; 341/101
(58) Field of Search ............................... 341/59, 58, 101, 341/100, 95; 370/536; 340/347

(56) References Cited

U.S. PATENT DOCUMENTS

| | | | |
|---|---|---|---|
| 4,499,454 | * | 2/1985 | Shimada .......................... 340/347 DD |
| 5,321,400 | * | 6/1994 | Sasaki et al. ........................ 341/100 |
| 5,726,990 | * | 3/1998 | Shimada et al. ..................... 370/536 |

FOREIGN PATENT DOCUMENTS

| | | |
|---|---|---|
| 5-114925 | 5/1993 | (JP) . |
| 6-104954 | 4/1994 | (JP) . |
| 7-273742 | 10/1995 | (JP) . |
| 8-221248 | 8/1996 | (JP) . |

* cited by examiner

Primary Examiner—Brian Young
Assistant Examiner—John Nguyen
(74) Attorney, Agent, or Firm—Sughrue, Mion, Zinn, Macpeak & Seas, PLLC

(57) ABSTRACT

In a parallel-to parallel converter for converting an "m"-bit parallel signal into an "n"-bit parallel signal, a common multiple register has a bit width which is a common multiple of "m" and "n". An input selector is connected to an input of the common multiple register, and writes the "m"-bit parallel signal into the common multiple register at a predetermined frequency. An output selector is connected to an output o f the common multiple register, and reads the "n"-bit parallel signal from the common multiple register at a frequency equal to m/n times the predetermined frequency.

15 Claims, 15 Drawing Sheets

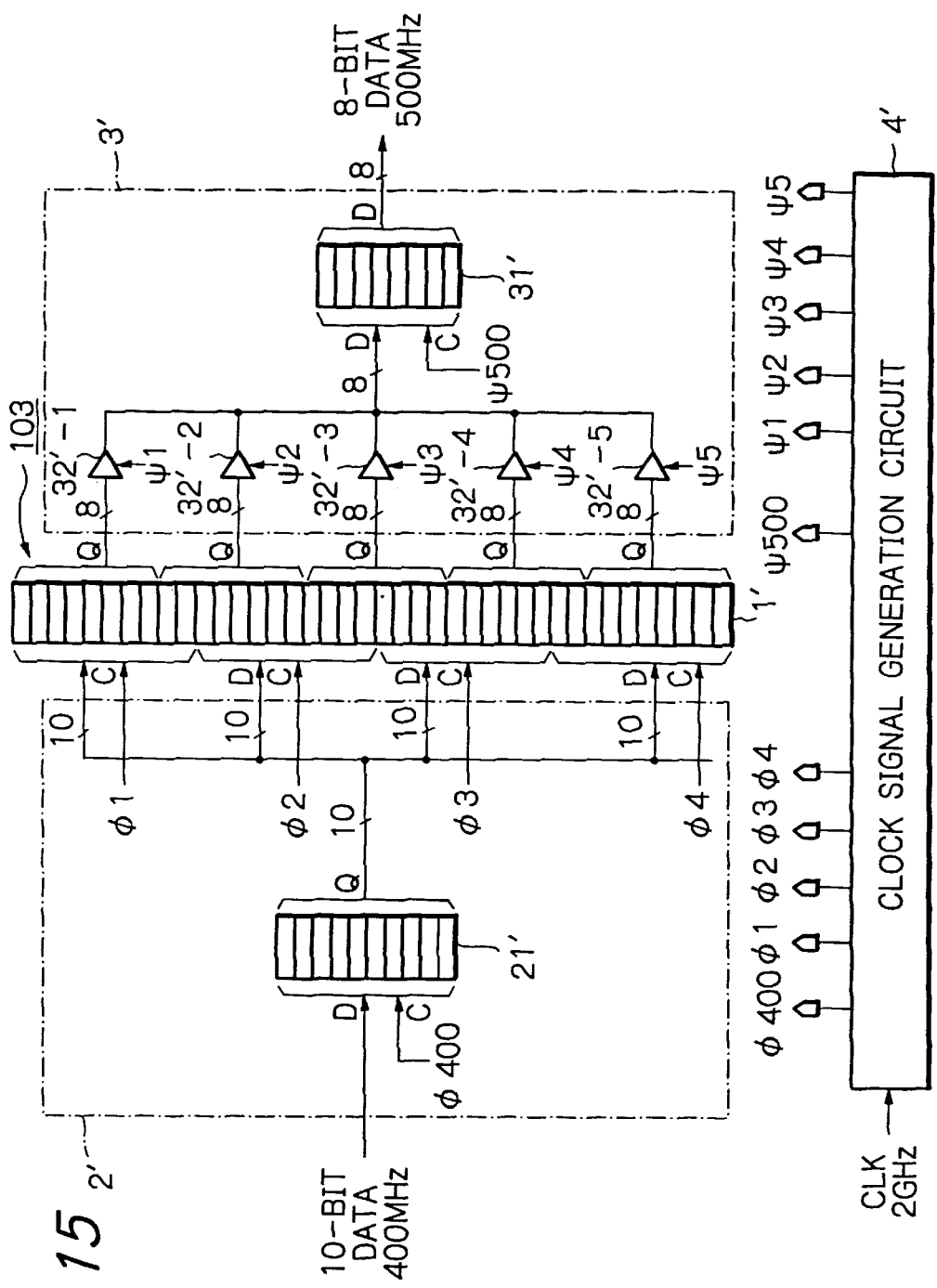

PARALLEL-TO-PARALLEL CONVERTER INCLUDING COMMON MULTIPLE REGISTER

BACKGROUND OF THE INVENTION

1. Field of the Invention

The present invention relates to a parallel-to-parallel converter used in a serial communication system for optical communications.

2. Description of the Related Art

In the field of serial communications such as optical communications, encoding techniques such as adding redundant bits to each signal for preventing consecutive high levels and low levels from taking place and keeping the ratio of high levels to low-levels constant are generally used. With a popular encoding technique called 8B10B, 8-bit data are transformed into 10-bit data before they are transmitted. On the receiving side, the received 10-bit data are transformed back into 8-bit data before they are decoded.

In a prior art serial communication system, a transmitter is formed by an 8B10B encoder and a 10 bit-to-1 bit (10-to-1) multiplexer, and a receiver is formed by a 1 bit-to-10 bit (1-to-10) demultiplexer and a 10B8B decoder. This will be explained later in detail.

In the prior art system, the transformation of a parallel signal into a serial signal and vice versa is carried out on the basis of a unit of 10 bits. Thus, the 10-to-1 multiplexer and the 1-to-10 demultiplexer are indispensable for converting the parallel signal into the serial signal and vice versa.

On the other hand, a tree-type multiplexer (or demultiplexer) adapted to a high speed parallel-to-serial (or serial-to-parallel) conversion by means of 2-to-1 multiplexers (or 1-to-2 demultiplexers) are known.

However, it is impossible to apply the high speed tree-type multiplexer or demultiplexer to the prior art serial communication system, because each circuit element is based on a 2-input and 1-output or 1-input and 2-output arrangement.

SUMMARY OF THE INVENTION

It is an object of the present invention to provide a parallel-to-parallel converter suitable for use in a high speed serial communication system.

According to the present invention, in a parallel-to-parallel converter for converting an "m"-bit parallel signal into an "n"-bit parallel signal, a common multiple register has a bit width which is a common multiple of "m" and "n". An input selector is connected to an input of the common multiple register, and writes the "m"-bit parallel signal into the common multiple register at a predetermined frequency. An output selector is connected to an output of the common multiple register, and reads the "n"-bit parallel signal from the common multiple register at a frequency equal to m/n times the predetermined frequency.

BRIEF DESCRIPTION OF THE DRAWINGS

The present invention will be more clearly understood from the description as set below, as compared with the prior art, with reference to the accompanying drawings, wherein:

FIG. 15 is a detailed circuit diagram of the 10-to-8 converter of FIG. 7.

DESCRIPTION OF THE PREFERRED EMBODIMENT

Before the description of the preferred embodiment, a prior art serial communication system will be explained with reference to FIGS. 1, 2, 3, 4 and 5.

Figure 1:
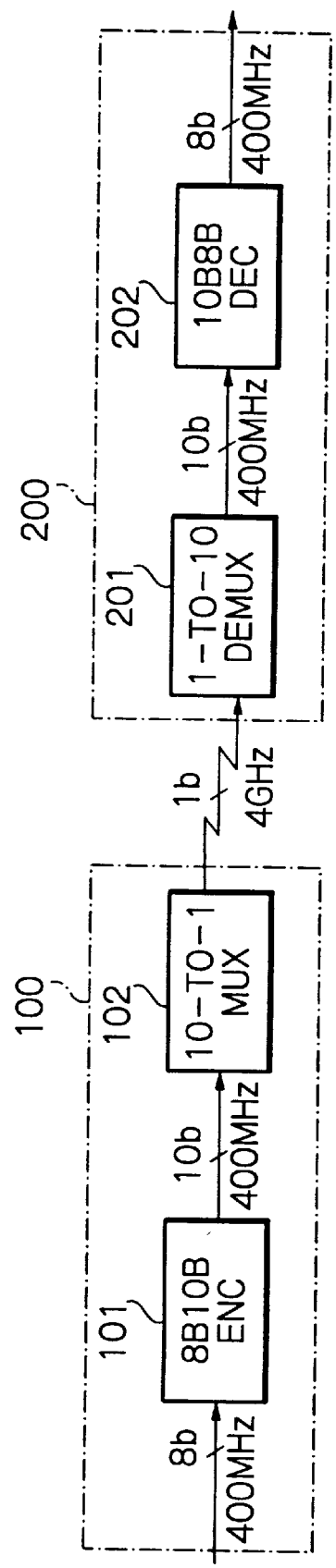
FIG. 1 is a block circuit diagram illustrating a prior art serial communication system.

In FIG. 1, which illustrates a prior art serial communication system, for serially transmitting an 8-bit 400 MHz signal, reference numeral 100 designates a transmitter formed by an 8B10B encoder 101 and a 10 bit-to-1 bit (10-to-1) multiplexer 102, and 200 designates a receiver formed by a 1 bit-to-10 bit (1-to-10) demultiplexer 201 and a 10B8B decoder 202.

In the transmitter 100, the 8-bit 400 MHz input signal is firstly transformed into a 10-bit 400 MHz signal by the 8B10B encoder 101. Then, the 10-bit signal is further transformed into a 1-bit signal having a frequency multiplied by 10 by the 10-to-1 multiplexer 102. A serial data signal to be transmitted from the transmitter 100 will be a 4 Gbps signal.

In the receiver 200, the received 4Gbps serial data signal is transformed into a 10-bit 400 MHz signal by the 1-to-10 demultiplexer 201. Then, the original 8-bit 400 MHz signal is reproduced by the 10B8B decoder 202.

In the system of FIG. 1, the transformation of a parallel signal into a serial signal and vice versa is carried out on the basis of a unit of 10 bits. Thus, the 10-to-1 multiplexer 102 and the 1-to-10 demultiplexer 201 are indispensable for converting the parallel signal into the serial signal and vice versa.

Figure 2:
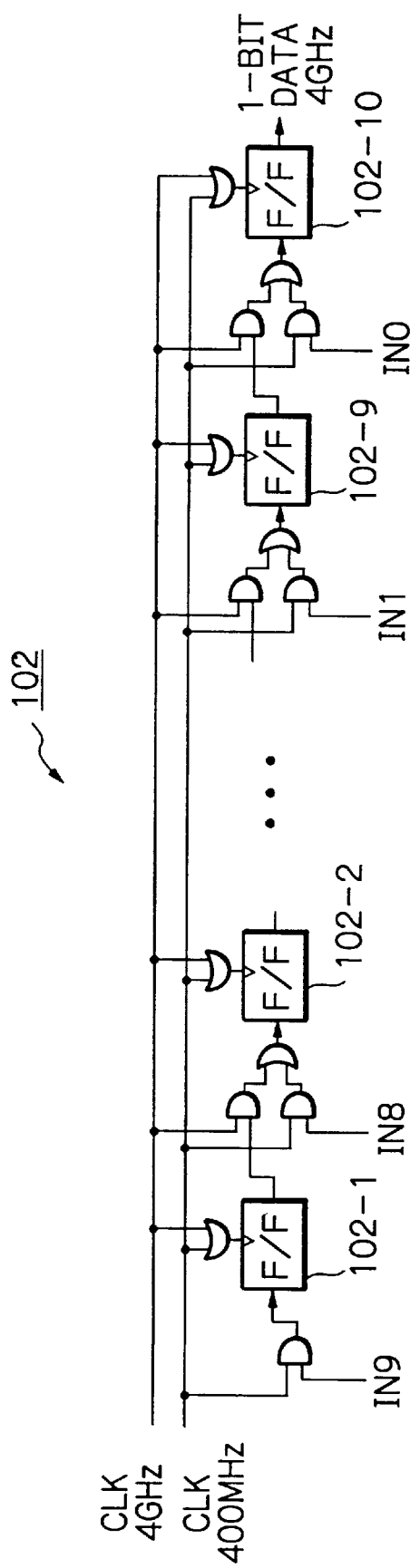
FIG. 2 is a detailed circuit diagram of the 10-to-1 multiplexer of FIG. 1.

In FIG. 2, which is a detailed circuit diagram of the 10-to-1 multiplexer of FIG. 1, D-type flip-flops 102-1, 102-2, ----, 102-9 and 102-10 are connected in series, to form a shift register. In this case, input signals IN9, IN8, ----, IN1 and IN0 are input in parallel to the flip-flops 102-1, 102-3, ----, 102-9 and 102-10, respectively, in synchronization with a clock signal having a frequency of 400 MHz. On the other hand, the flip-flops 102-1, 102-2, ----, 102-9 and 102-10 performs a shift operation in synchronization with a clock signal having a frequency of 4 GHz, so that a 4 GHz serial data signal is output.

Figure 3:
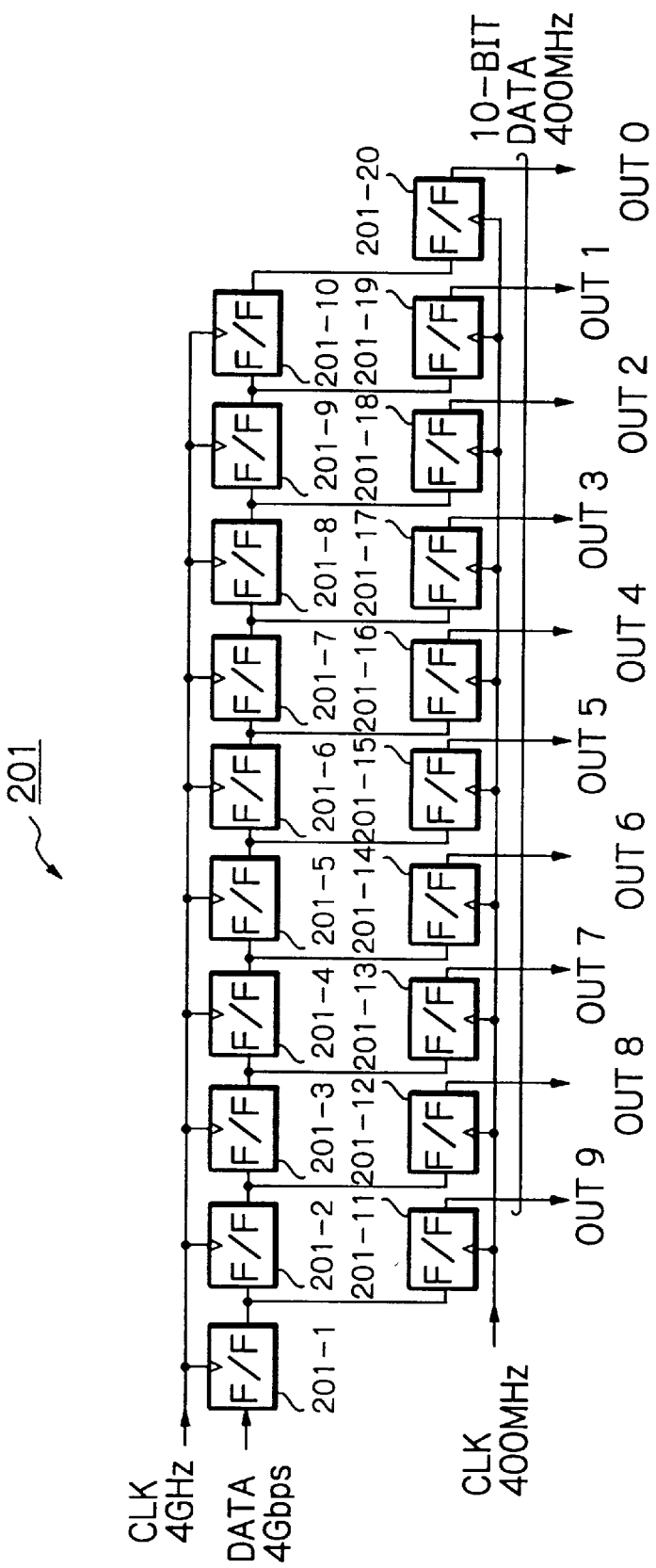
FIG. 3 is a detailed circuit diagram of the 1-to-10 demultiplexer of FIG. 1.

In FIG. 3, which is a detailed circuit diagram of the 1-to-10 demultiplexer of FIG. 1, a 4 Gbps serial signal is sequentially written into a shift register formed by D-type flop-flops 21-1 through 201-10 adapted to operate at 4 GHz. Then, the outputs of the flip-flops 201-1 through 201-10 are fed to D-type flip-flops 201-11 through 201-20 using a clock signal of 400 MHz. As a result, a 10-bit parallel signal as expressed by OUT0 through OUT9.

However, the circuits of FIGS. 2 and 3 include a number of circuit elements that operate at 4 GHz and require inputs of the 4 GHz clock signal. Therefore, it is difficult to design such circuits particularly in terms of operating timing.

Figure 4:
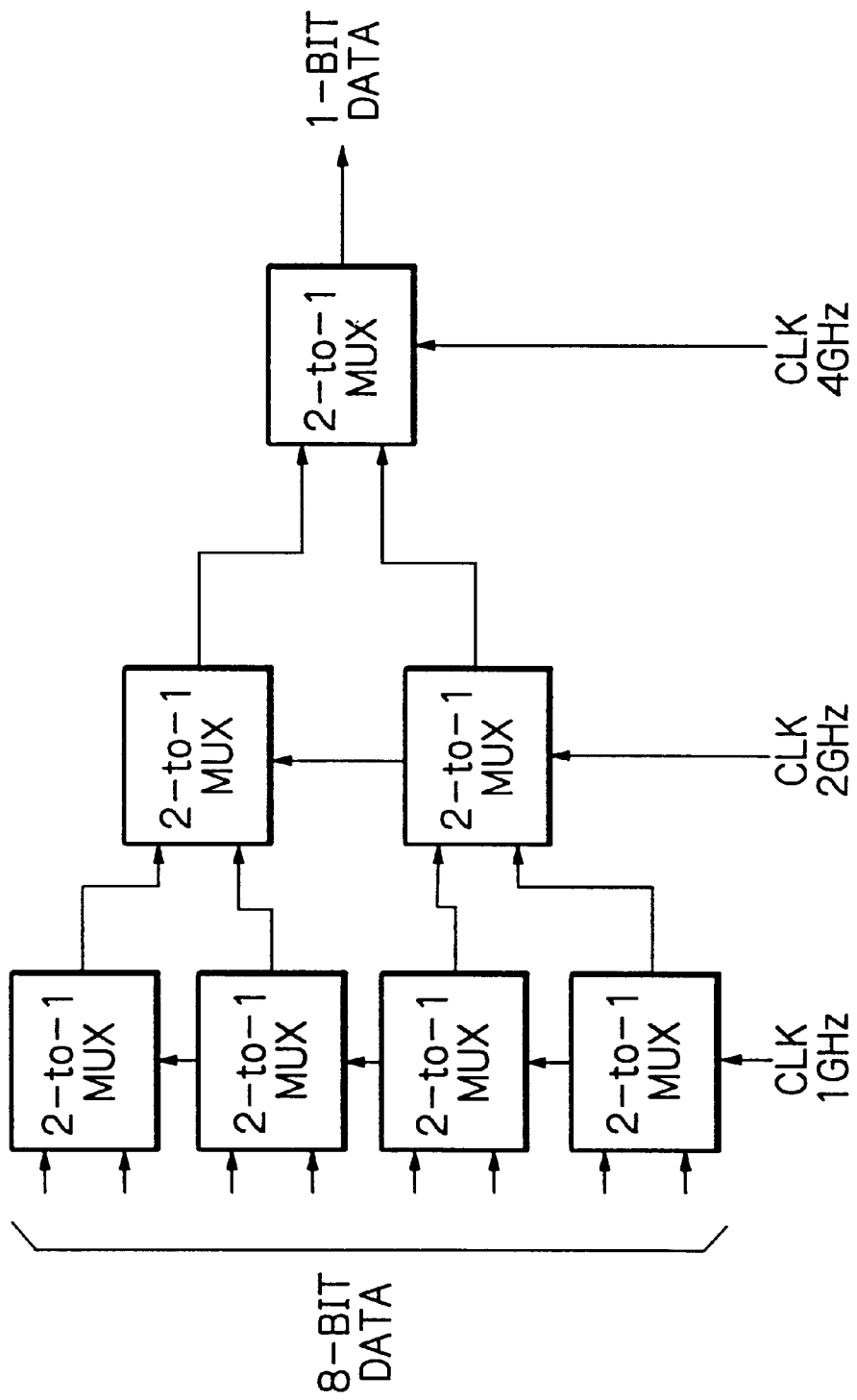
FIG. 4 is a block circuit diagram illustrating a prior art tree-type multiplexer.
Figure 5:
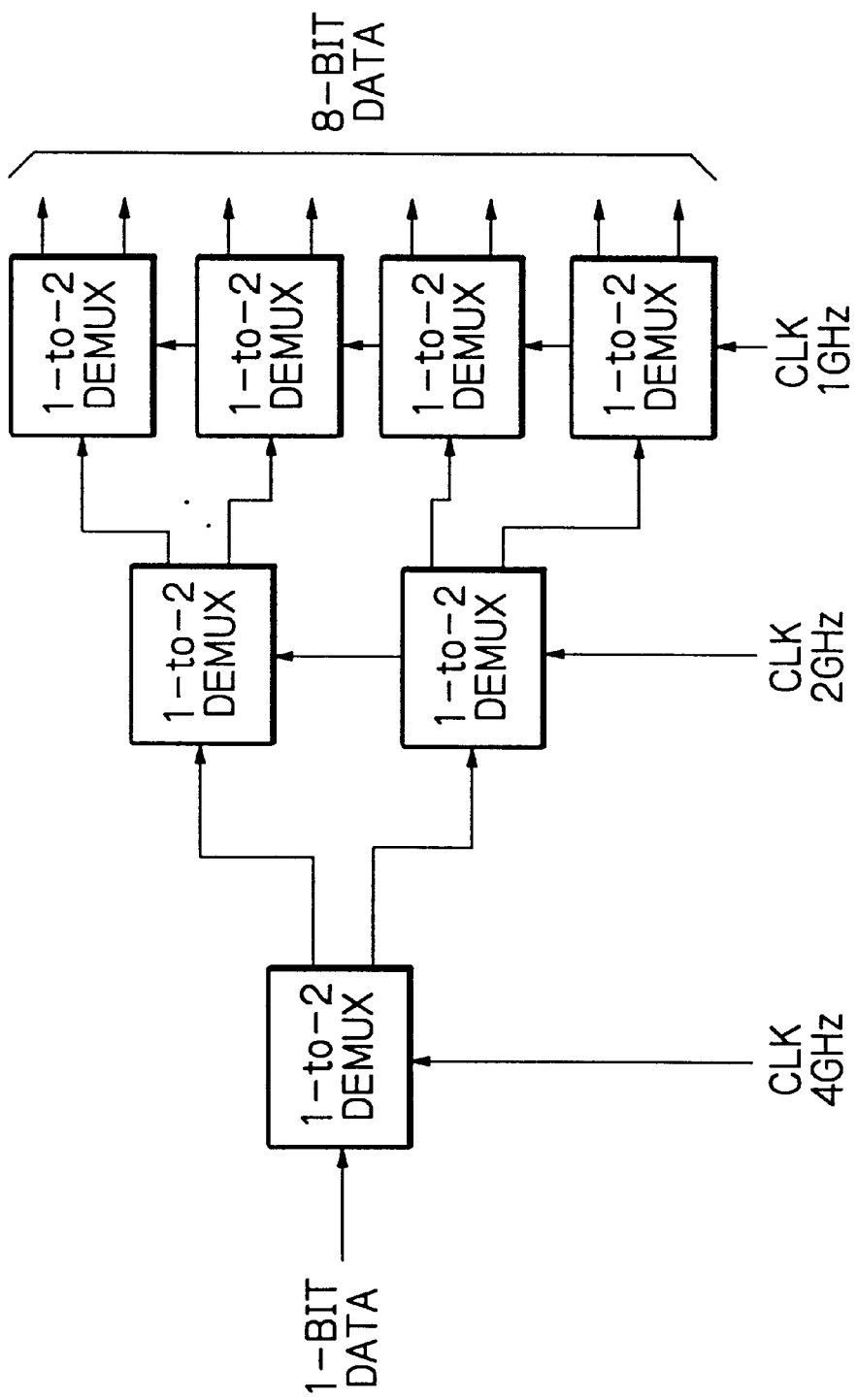
FIG. 5 is a block circuit diagram illustrating a prior art tree-type demultiplexer.

On the other hand, a tree-type multiplexer adapted to a high speed parallel-to-serial conversion by means of 2-to-1 multiplexers as illustrated in FIG. 4 is known. Similarly, a tree-type demultiplexer adapted to high speed serial-to-parallel conversion by means of 1-to-2 demultiplexers as illustrated in FIG. 5 is known. Each of the circuits as illustrated in FIGS. 4 and 5 has a smaller number of circuit elements that are required to operate at speed if compared with the circuits of FIGS. 2 and 3. Thus, the circuits as illustrated in FIGS. 4 and 5 are easier to design and adapted to operate at high speed.

However, the high speed tree-type multiplexer as illustrated in FIG. 4 needs 2 inputs (R=1, 2, ----), because each circuit element is based on a 2-input and 1-output arrangement. Therefore, the multiplexer of FIG. 4 can input a number of bits whose value is equal to the integer-th power of 2 such as 2, 4, 8, 16, 32,----. Thus, the multiplexer of FIG. 4 cannot input a 10-bit signal generated by the 8B10B encoder 101. Similarly, the high speed tree-type demultiplexer as illustrated in FIG. 5 needs 2 outputs (P=1, 2,----), because each circuit element is based on a 1-input and 2-output arrangement. Therefore, the demultiplexer as illustrated in FIG. 5 can output a number of bits whose value is equal to the integer-th power of 2 such as 2, 4, 8, 16, 32, ----. Thus, the demultiplexer of FIG. 5 cannot output a 10-bit signal for by the 10B8B decoder 202.

Therefore, the 10-to-1 multiplexer as illustrated in FIG. 2 and the 1-to-10 demultiplexer as illustrated in FIG. 3 have to be used in the serial communication system of FIG. 1.

As pointed out above, it is very desired for the multiplexer 102 and the demultiplexer 201 of FIG. 1 that both are required to have a high operating frequency and operate at high speed to use binary tree-type multiplexer and demultiplexer having a simple configuration and adapted to operate at high speed as illustrated in FIGS. 4 and 5.

Figure 6:
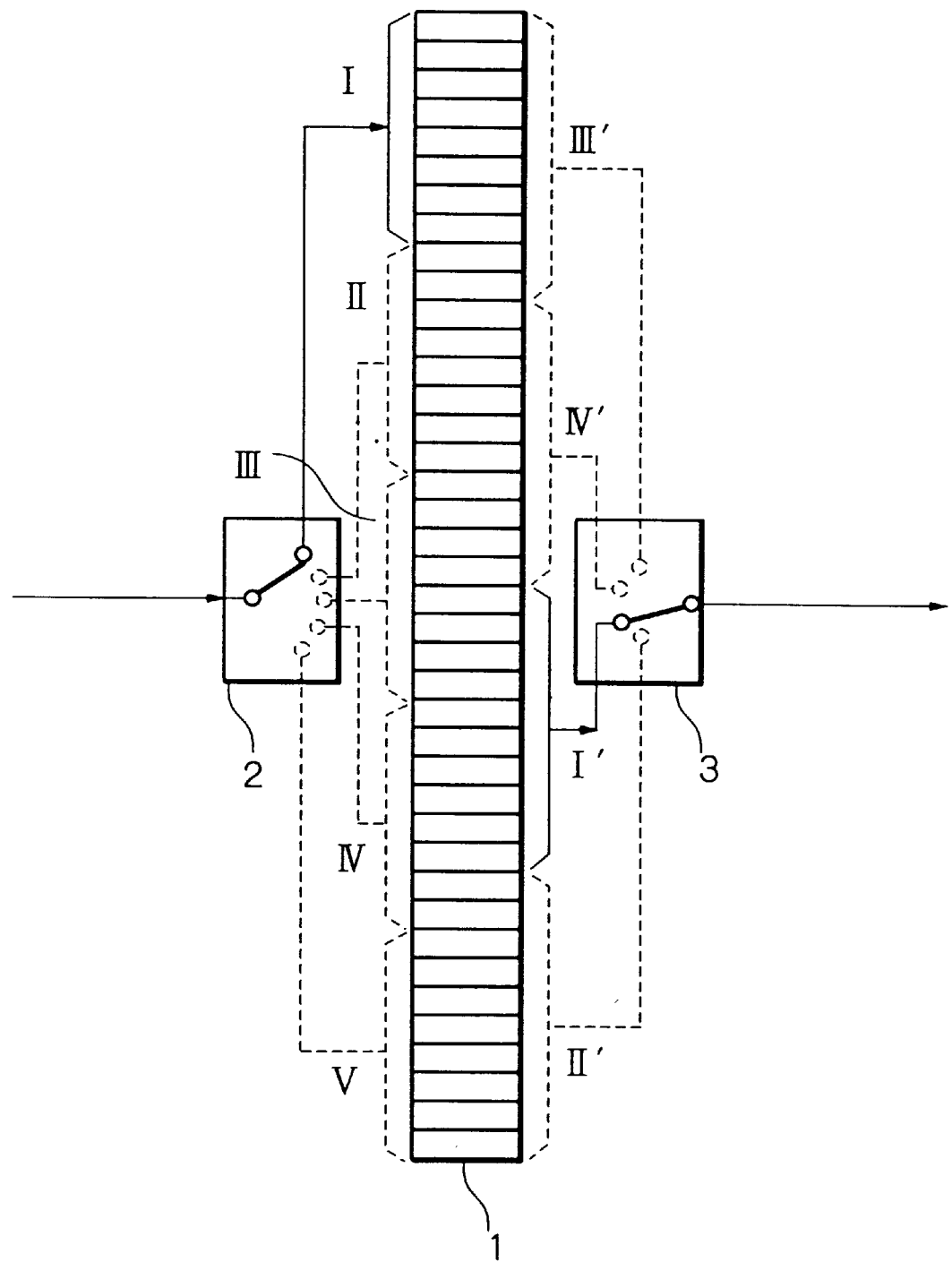
FIG. 6 is a circuit diagram illustrating a parallel-to-parallel converter according to the present invention.

In FIG. 6, which illustrates a parallel-to-parallel converter according to the present invention, an "m"-bit data signal is input and an "n"-bit data signal is output. The parallel-to-parallel converter of FIG. 6 is constructed by a common multiple register 1 having a bit width "q" which is a common multiple of "m" and "n", an input selector 2 connected to an input of the common multiple register, 1 and an output selector 3 connected to an output of the common multiple register 1. For example, if m=8 and n=10, q=40. In this case, the input selector 2 is a 1-input, 5-output selector, and the output selector 3 is a 4-input, 1-output selector.

In FIG. 6, the common multiple register 1 sequentially stores an 8-bit input signal using a clock signal of 500 MHz by way of the input selector 2. On the other side, the output selector 2 selects on a 10 bit by 10 bits basis using a clock signal of 400 MHz.

More specifically, data are stored in the common multiple register 1 on an 8 bit by 8 bit basis in the sequence of I, II, III, IV and V as shown on the side of the input selector 1. On the other hand, data are read from the common multiple register 1 on a 10 bits by 10 bits basis in the sequence of I', II', III', IV' and V' as shown on the side of the output selector 3.

Thus, the timing of the switching operation of the input selector 2 is shifted by half of a period (100 MHz: 10 ns) of selecting the common multiple register 1 from that of the switching operation of the output selector 3. In FIG. 6, note that a portion currently being selected is indicated by a solid line and portions currently not being selected are indicated by broken lines. With such sequential selection, the operation of writing data into the common multiple register 1 and the operation of reading data from the common multiple register 1 never take place concurrently, so that a wide margin of timing can be obtained.

Figure 7:
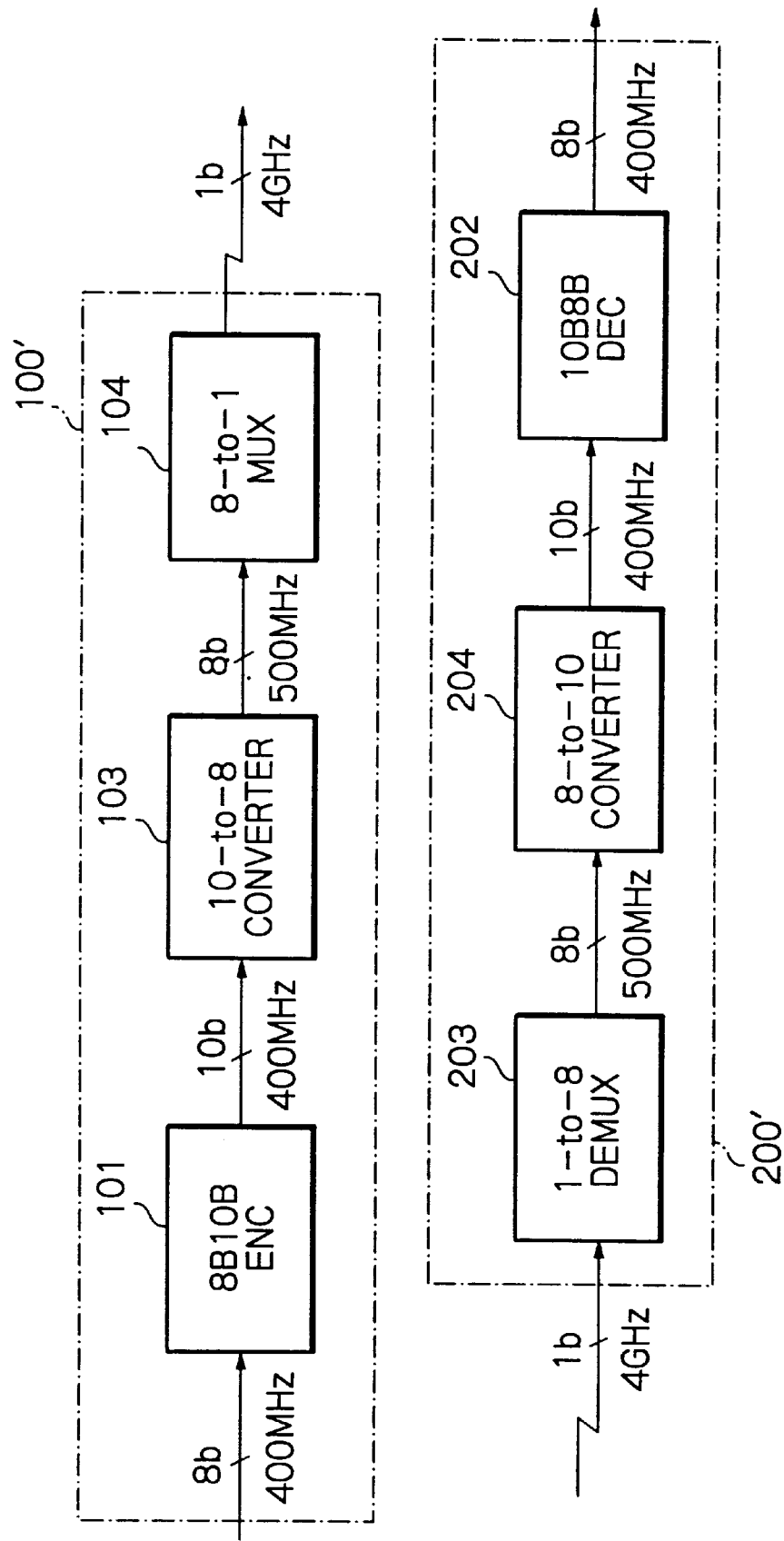
FIG. 7 is a block circuit diagram illustrating an embodiment of the serial communication system according to the present invention.

In FIG. 7, which illustrates an embodiment of the serial communication system according to the present invention, the transmitter 100 of FIG. 1 is modified into a transmitter 100' where a 10-to-8 converter 103 and an 8-to-1 tree-type multiplexer 104 are provided instead of the 10-to-1 multiplexer 102 of FIG. 1. Also, the receiver 200 of FIG. 1 is modified into a receiver 200' where a 1-to-8 tree-type converter 203 and an 8-to-10 converter 204 are provided instead of the 1-to-10 demultiplexer 201 of FIG. 1. Note that the 8-to-1 tree-type multiplexer 104 is illustrated in FIG. 4, and the 1-to-8 tree-type demultiplexer 203 is illustrated in FIG. 5.

Each of the 10-to-8 converter 103 and the 8-to-10 converter 204 has a similar configuration to the parallel-to-parallel converter as illustrated in FIG. 6.

In the transmitter 100', an 8- bit 400 MHz input signal is firstly transformed into a 10- bit 400 MHz signal by the 8B10B encoder 101. Then, the 10-Bit signal is further transformed into an 8-bit signal with a frequency equal to 10/8 of the input frequency, or 500 MHz by the 10-to-8 converter 103. Thus, the number of bits is converted to a number equal to the integer-th power of 2. Then, the 8-bit 500 MHz signal is fed to the 8-to-1 tree-type multiplexer 104 to obtain a 1-bit 40 Gbps serial signal.

In the receiver 200', on the other hand, the received serial signal is transformed into an 8-bit 500 MHz signal by the 1-to-8 tree-type demultiplex 203. The obtained signal is then further transformed into a 10-bit 400 MHz signal by the 8-to-10 converter 204. The 10-bit signal is then fed to the 10B8B decoder 202 to reproduce the original 8-bit 400 MHz signal.

Thus, the tree-type multiplexer 104 (the demultiplexer 203) and the 8B10B encoder 101 (the 10B8B decoder) are made compatible by means of the parallel to-parallel converter 103 (204) to realize an LSI circuit for high speed serial communications.

In the transmitter 100', the 10-to-8 converter 103 is connected to the 8-to-1 tree-type multiplexer 104 to form a 8 bits-to-1 bit conversion circuit. Generally, if a parallel-to-parallel converter for outputting a parallel signal of a number of bits, whose value is an integer-th power of 2, is connected to a tree-type multiplexer for transforming a parallel signal of a number of bits whose value is the integer-th power of 2 into a serial signal, a parallel-to-serial converter is realized.

Similarly, in the receiver 200', the 1-to-8 tree-type demultiplexer 203 is connected to the 8-to-10 converter 204, to form a 1bit-to-8bit conversion circuit. Generally, if a tree-type demultiplexer for outputting a parallel signal of a number of bits, whose value is an integer-th power of 2, is connected to a parallel-to-parallel converter for transforming a parallel signal of a number of bits whose value is the integer-th power of 2 into a parallel signal, a serial-to-paralle converter is realized.

The 8-to-10 converter 204 of FIG. 7 is explained in detail with reference to FIG. 8.

The 8-to-10 converter 204 is constructed by a clock signal generation circuit 4 in addition to the common multiple register 1, the input selector 2 and the output selector 3 of FIG. 6.

The input selector 2 includes an input register 21 for temporarily holding 8-bit data (500 MHz) to be stored in the common multiple register 1. Also, the output selector 3 includes an output register 31 for temporarily holding 10-bit data (400 MHz) output from the common multiple register 1, tri-state buffers 32-1 through 32-4 for controlling the input of the data from the common multiple register 1 to the output register 31.

The common multiple register 1 is comprised of 40 D-type flop-flops, the number 40 being a common multiple of 8 and 10. The data temporarily held in the input register 21 is stored into the 40 flop-flops from their D-input (data input) sides. The timings of outputting data from the Q-output (data output) sides of the common multiple register 1 to the output register 31 are controlled by controlling the tri-state buffers 32-1 through 32-4 by means of clock signals ø1 through 4.

Each of the tri-state buffers are activated when the corresponding one of the clock signals ø1 through ø4 is at a high level, whereas each tri-state buffer is held to a high impedance state when the corresponding one of the clock signals ø1 through ø4 is at a low level L.

The operation of the 8-to-10 converter 204 is explained next by referring to FIG. 9. Since a time period t1 of 10 ns is equal to 2 ns ×5 cycles, a time period t2 of a 500 MHz clock signal ø500 is 2 ns. On the other hand, since the time period t1 of 10 ns is equal to 2.5 ns×4 cycles, a time period t3 of a 400 MHz clock signal ø400 is 2.5 ns.

Figure 9:
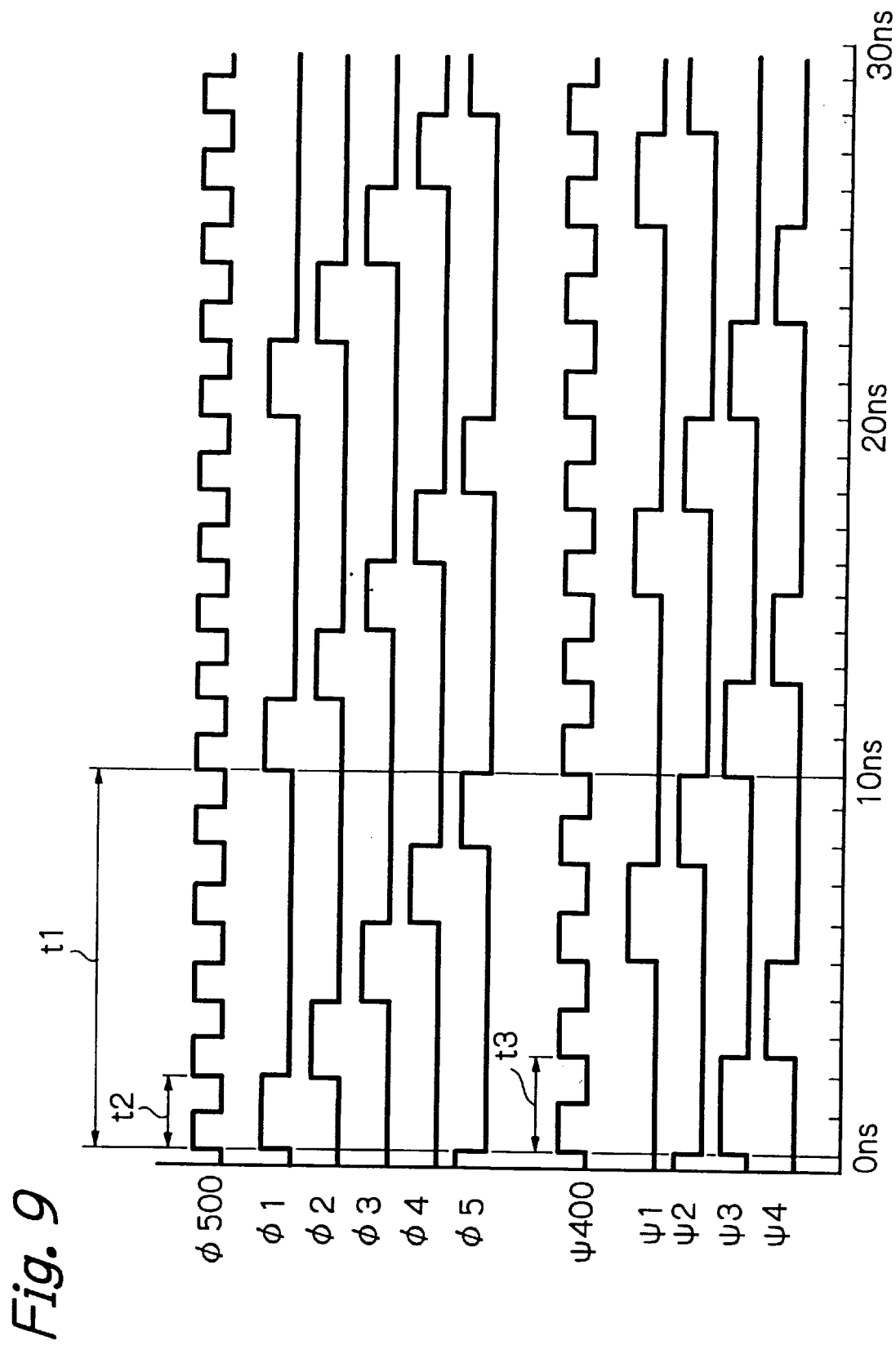
FIG. 9 is a timing diagram showing the operation of the parallel-to-parallel converter of FIG. 8.

As shown in FIG. 9, five different clock signals ø1 through ø5 are generated on the basis of the 500 MHz clock signal ø500. More specifically, the clock signals ø1 through ø5 have respective phases that are shifted from each other and data are sequentially stored in the common multiple register 1 by means of the clock signals ø1 through ø5.

Similarly, four different clock signals ø1 through ø4 are generated on the basis of the 400 MHz clock signal ø400. More specifically, the clock signals ø1 through ø4 have respective phases that are shifted from each other and data are sequentially read from the common multiple register 1 by means of the clock signals ø1 through ø4.

Figure 8:
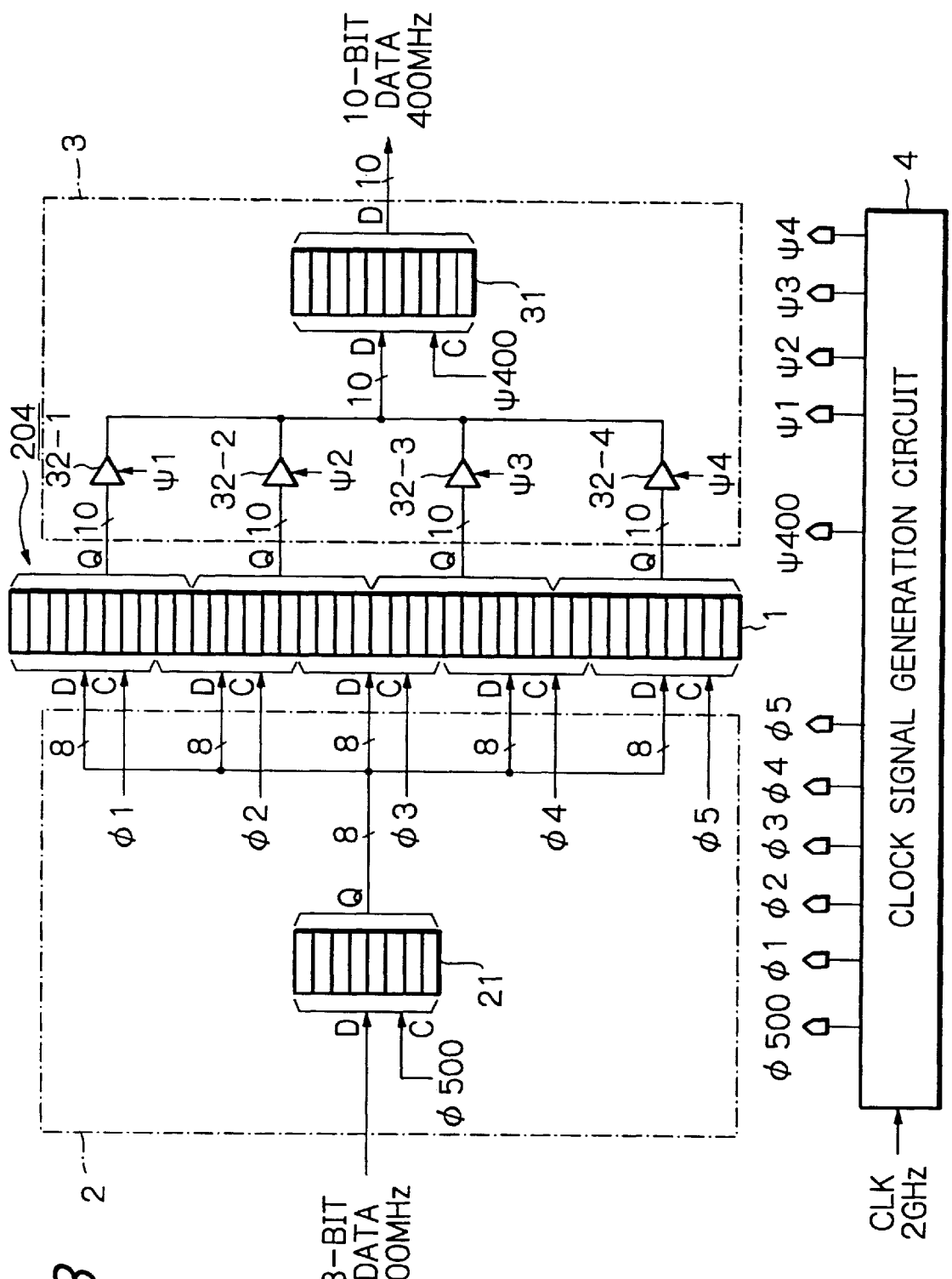
FIG. 8 is a detailed circuit diagram of the parallel-to-parallel converter of FIG. 7.
Figure 10:
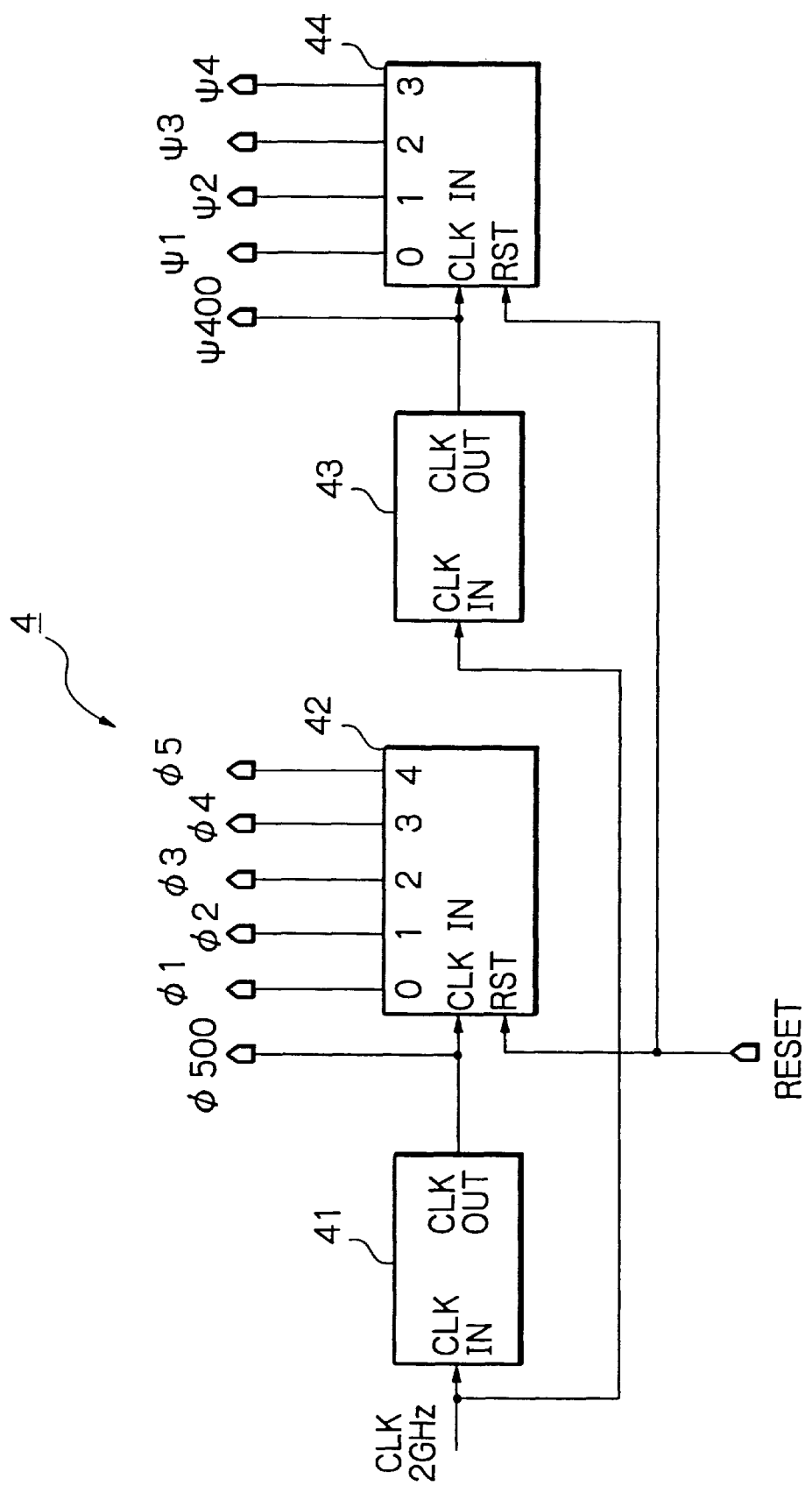
FIG. 10 is a detailed circuit diagram of the clock signal generation circuit of FIG. 8.

In FIG. 10, which is a detailed circuit diagram of the clock signal generation circuit 4 of FIG. 8, a 4-frequency divider 41 is provided to receive a 2 GHz clock signal CLK, thus generating the 500 MHz clock signal ø500. The 500 MHz clock signal ø500 is supplied to a ring counter 42 with a decoding function, which ring counter 42 generates the clock signals ø1 through ø5 whose phases are shifted from each other. On the other hand, a 5-frequency divider 43 is provided to receive the 2 GHz clock signal CLK, thus generating the 400 MHz clock signal ø400. The 400 MHz clock signal ø400 is supplied to a ring counter 44 with a decoding function, which ring counter 44 generates the clock signals ø1 through ø4 whose phases are shifted from each other.

Note that the ring counters 41 and 43 are reset simultaneously when a reset signal RESET is input.

Figure 11:
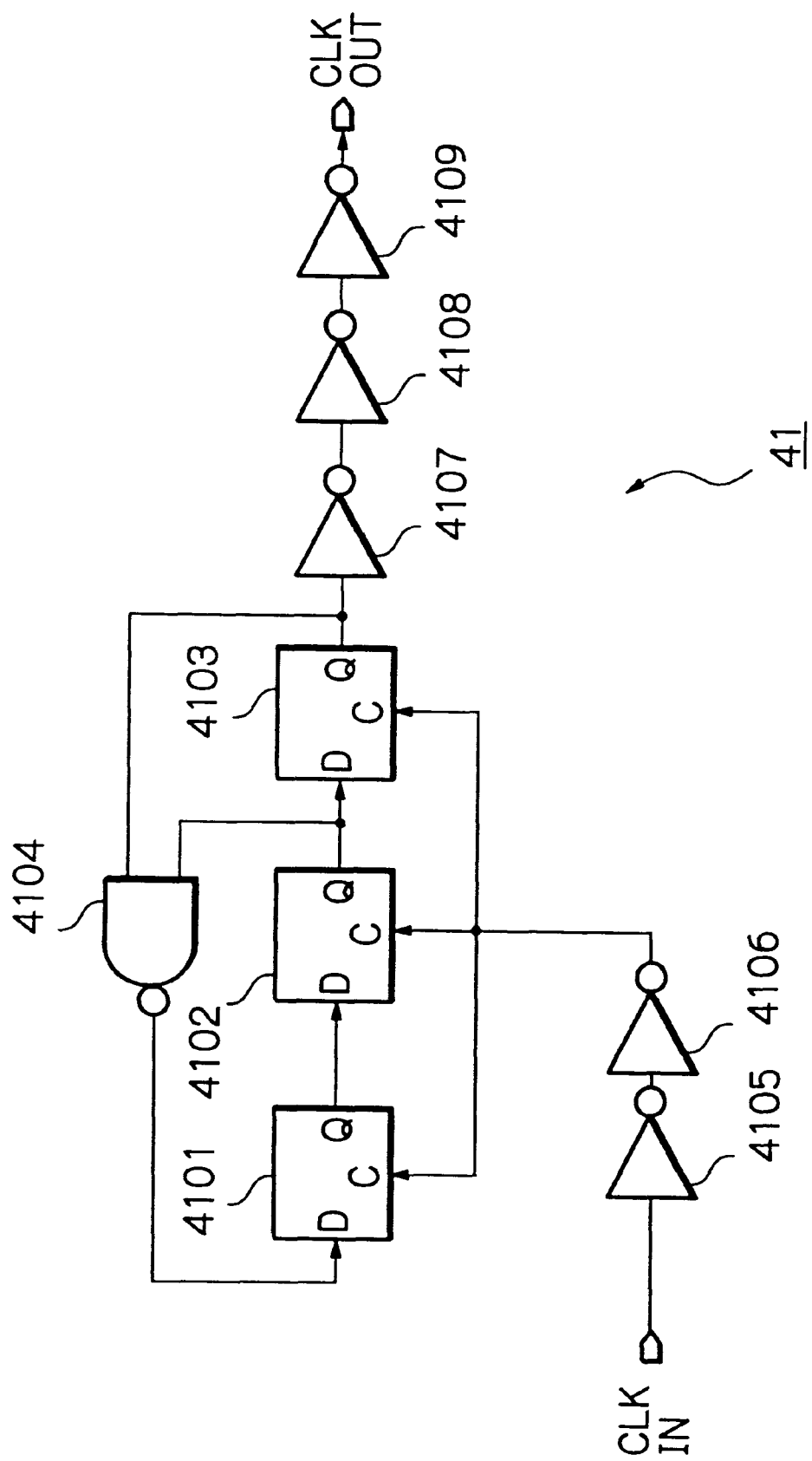
FIG. 11 is a detailed circuit diagram of the 5 frequency divider of FIG. 10.

In FIG. 11, which is a detailed circuit diagram of the 5-frequency divider 41 of FIG. 10, the 5-frequency divider 41 includes three-stage D-type flip-flops 4101 through 4103. The outputs of the flip-flops 4102 and 4103 are fed to a NAND circuit 4104 whose output is then input to the flip-flop 4101. An input clock signal is supplied to the flip-flops 4101, 4102 and 4103 by way of inverters 4105 and 4106. Also, an output clock signal is output by way of inverters 4107, 4108 and 4109.

Figure 12:
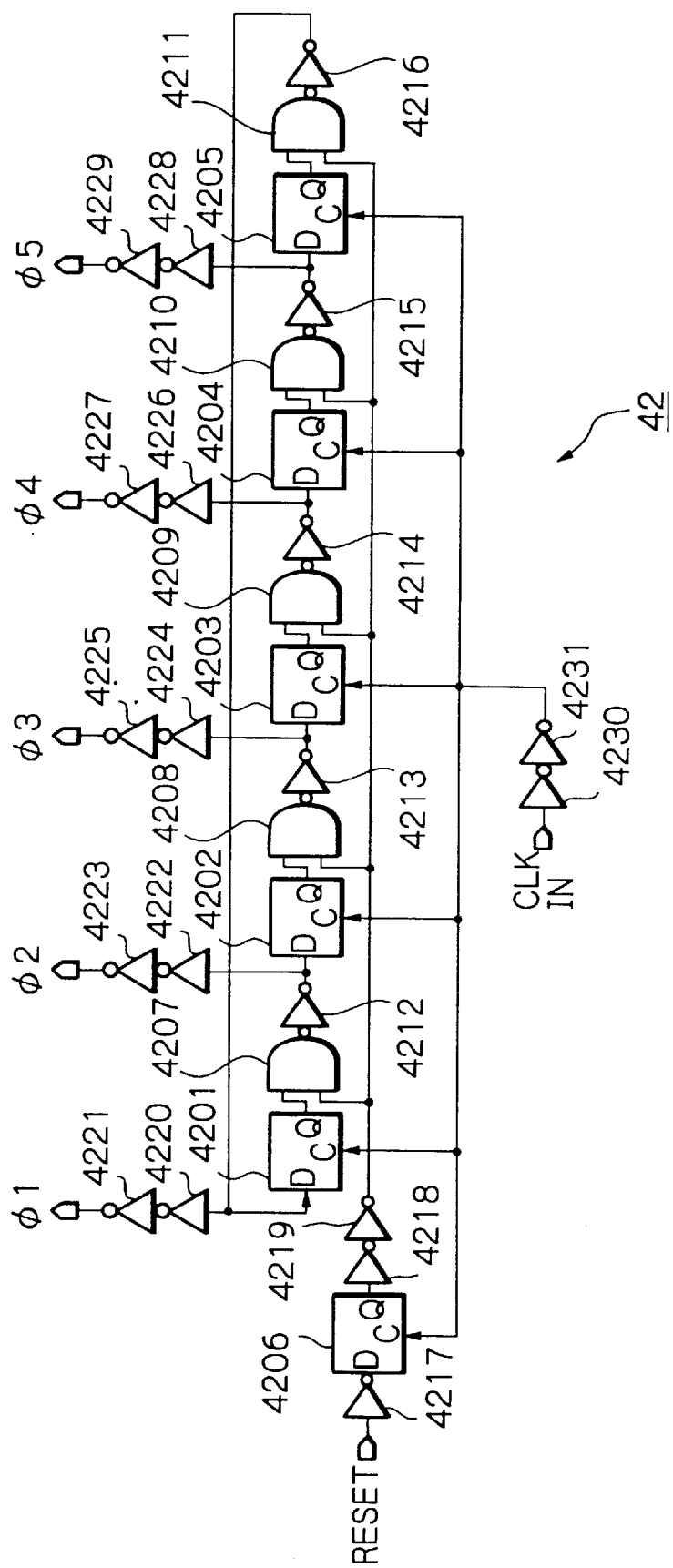
FIG. 12 is a detailed circuit diagram of one of the ring counters of FIG. 10.

In FIG. 12, which is a detailed circuit diagram of the ring counter 42 of FIG. 10, 5-stage D-type flip-flops 4201 through 4205 are provided, and the clock signals ø1 through ø5 are fed out of the respective stages.

Inputs of NAND circuits 4207 through 4201 are connected to the respective outputs of the flip-flops 4201 through 4205. A reset signal output from a D-type flip-flop 4206 is applied to the other input of each of the NAND circuits 4207 through 4211. Thus, all the flip-flops 4201 through 4206 are reset simultaneously upon receiving a reset signal RESET.

In FIG. 12, reference numerals 4212 through 4231 designate inverters. Clock signals are applied to the respective flip-flops 4201 through 4206 by way of the inverters 4230 and 4231.

Figure 13:
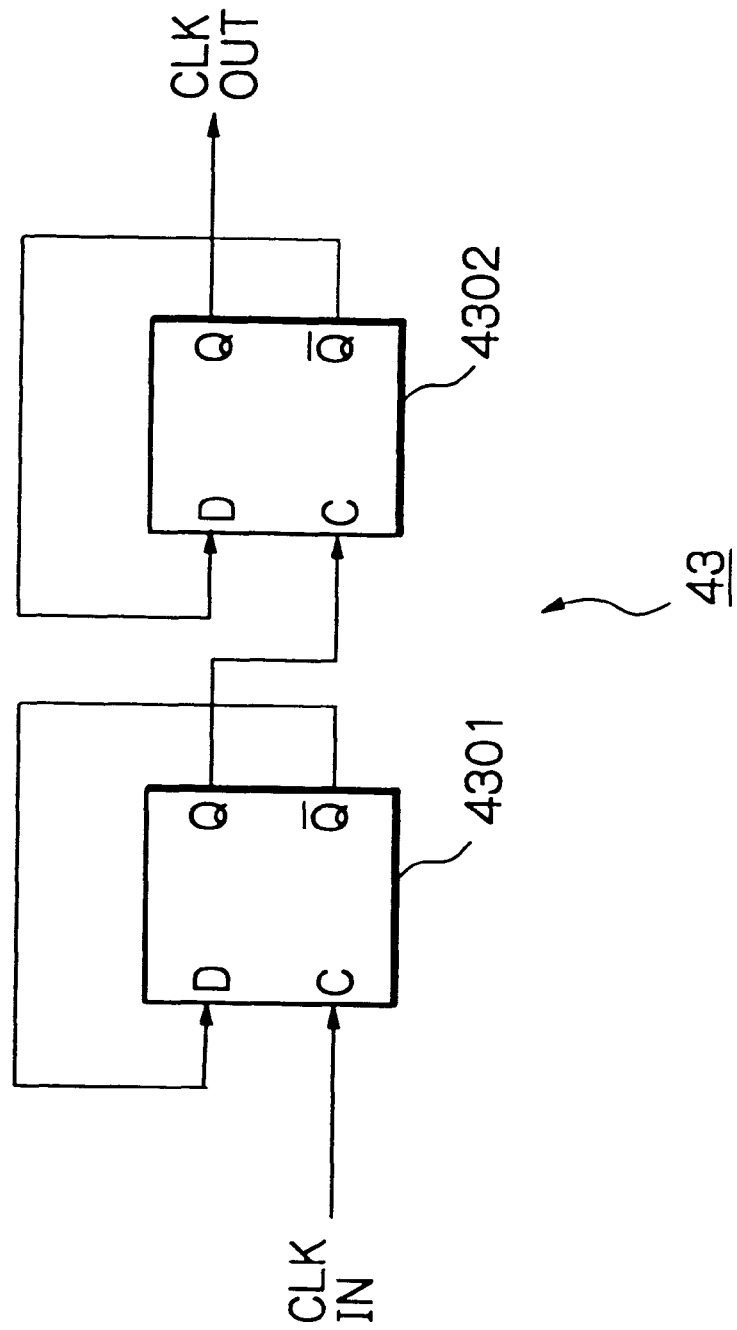
FIG. 13 is a detailed circuit diagram of the 4 frequency divider of FIG. 10.

In FIG. 13, which is a detailed circuit diagram of the 4-frequency divider 43 of FIG. 10, the 4-frequency divider 44 includes D-type flip-flops and 4302. The inverted Q output of each of the D-type flip-flops is connected to the D input thereof to make it equivalent to a known T-type flip-flop. As T-type flip-flops are connected in two stages, the first stage T-type flip-flop serves as a 2-frequency divider, and the second stage T-type flip-flop also serves as a 2-frequency divider. Therefore, the circuit of FIG. 13 serves as a 4-frequency divider.

Figure 14:
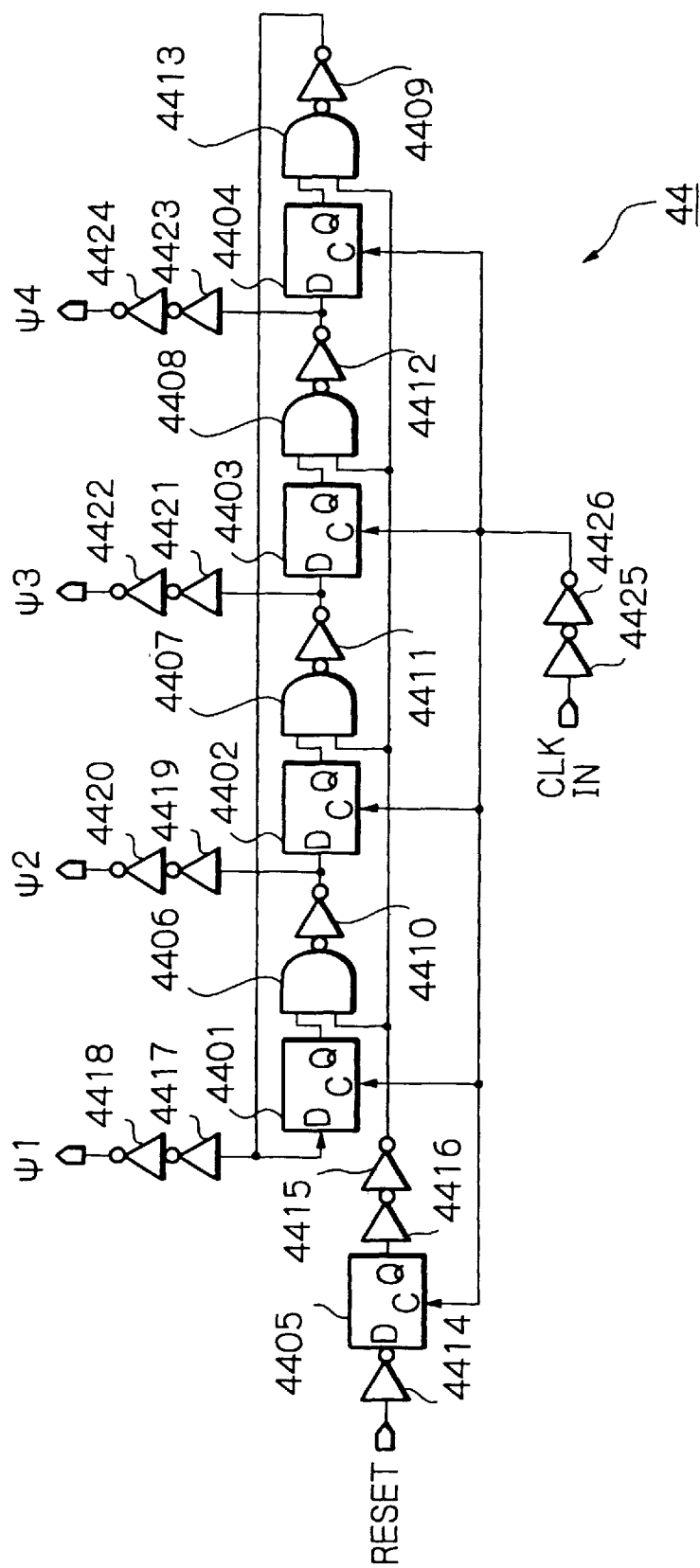
FIG. 14 is a detailed circuit diagram of the other of the ring counters of FIG. 10.

In FIG. 14, which is a detailed circuit diagram of the ring counter 44 of FIG. 10, 4-stage D-type flip flops 4401 through 4404 are provided, and the clock signals ø1 through ø4 are fed out of the respective stages.

Inputs of NAND circuits 4406 through 4409 are connected to the respective outputs of the flip-flops 4401 through 4404. A reset signal output from a D-type flip-flop 4405 is applied to the other input of each of the NAND circuits 4406 through 4409. Thus, all the flip-flops 4401 through 4405 are reset simultaneously upon receiving a reset signal RESET.

In FIG. 14, reference numerals 4410 through 4426 designate inverters. Clock signals are applied to the respective flip-flops 4401 through 4405 by way of the inverters 4425 and 4426.

As illustrated in FIG. 15, the 10-to-8 converter 103 of FIG. 7 has a similar configuration to the 8-to-10 converter 204. That is, the 10-to-8 converter 103 is constructed by a common multiple register 1', and input selector 2', an output selector 3' and a clock signal generation circuit 4' corresponding to the common multiple register 1, the input selector 2, the output selector 3 and the clock signal generation circuit 4, respectively, of FIG. 8. Since the common multiple register 1', the input selector 2', the output selector 3' and the clock signal generation circuit 4' have similar configurations to the common multiple register 1, the input selector 2, the output selector 3 and the clock signal generation circuit 4, respectively, the details thereof are omitted.

According to the circuits of FIGS. 8 and 15, it is possible to realize a parallel-to-parallel converter adapted to transform a parallel signal of any number of bits into another parallel signal of a different number of bits.

Also, according to the circuits of FIGS. 7 and 8, a serial-to-parallel converter adapted to quickly transform a serial signal into a parallel signal of any number of bits can be realized by combining such a parallel-to-parallel converter and a serial-to-parallel conversion circuit for outputting an input signal to the former circuit.

Further, according to the circuits of FIGS. 7 and 15, a parallel-to-serial conversion circuit adapted to quickly transform a parallel signal of any number of bits into a serial signal can be realized by combining such a parallel-to-parallel converter circuit and a parallel-serial conversion circuit.

As explained hereinabove, according to the present invention, there is provided a parallel-to-parallel converter for converting an "m"-bit input signal having a predetermined frequency into an "n"-bit input signal having a predetermined frequency m/n times greater than the predetermined frequency, and either n or m represents the i-th power (i=1, 2, ----) of two. Such a parallel-parallel converter circuit can suitably be used for a high speed serial communications circuit. A parallel-to-serial converter and a serial-to-parallel converter can also be realized by using such a parallel-parallel converter.

What is claimed is:

1. A parallel-to-parallel converter for converting an "m"-bit parallel signal into an "n"-bit parallel signal, comprising:
    a common multiple register having a bit width which is a common multiple of "m" and "n";
    an input selector, connected to an input of said common multiple register, for writing said "m"-bit parallel signal into said common multiple register at a predetermined frequency; and
    an output selector, connected to an output of said common multiple register, for reading said "n"-bit parallel signal from said common multiple register at a frequency equal to m/n times said predetermined frequency.

2. The parallel-to-parallel converter as set forth in claim 1, wherein one of said "m" and "n" is the i-th power of 2 (i=1, 2, --- ).

3. The parallel-to-parallel converter as set forth in claim 1, wherein a timing of writing said "m"-bit parallel signal into said common multiple register is different from a timing of reading said "n"-bit parallel signal from said common multiple register.

4. The parallel-to-parallel converter as set forth in claim 1, further comprising a clock signal generation circuit, said clock signal generation circuit comprising;
    an "N"-frequency divider for dividing a frequency of a clock signal by "N",
    a first ring counter, connected to said "N"-frequency divider, for counting an output signal of said "N"-frequency divider;
    an "M"-frequency divider for dividing the frequency of said clock signal by "M", wherein M/N is equal to m/n; and
    a second ring counter, connected to said "M"-frequency divider, for counting an output signal of said "M"-frequency divider;
    said input selector comprising an input register, connected to said "N"-frequency divider, for storing said "m"-bit parallel signal in synchronization with the output signal of said "N"-frequency divider,
    said output selector comprising an output register, connected to said "M"-frequency divider, for storing said "n"-bit parallel signal in synchronization with the output signal of said "M"-frequency divider,
    said common multiple register being connected to said first and second ring counters, a write operation upon said common multiple register being carried out in synchronization with an output signal of said first ring counter, a read operation upon said common multiple register being carried out in synchronization with an output signal of said second ring counter.

5. A parallel-to serial converter circuit comprising:
    a parallel-to-parallel converter for converting a "m"-bit parallel signal into a "n"-bit parallel signal where "n" is the i-th power of 2 (i=1,2,---); and
    a tree-type parallel-to-serial converter, connected to said parallel-to parallel converter, for converting said "n"-bit parallel signal into a serial signal,
    said parallel-to-parallel converter comprising:
        a common multiple register having a bit width which is a common multiple of "m" and "n";
        an input selector, connected to an input of said common multiple register, for writing said "m"-bit parallel signal into said common multiple register at a predetermined frequency; and
        an output selector, connected to an output of said common multiple register, for reading said "n"-bit parallel signal from said common multiple register at a frequency equal to m/n times said predetermined frequency.

6. A serial-to-parallel converter circuit comprising:
    a tree-type serial-to-parallel converter for converting a serial signal into an "m"-bit parallel signal where "m" is the i-th power of 2 (i=1,2, --- ); and
    a parallel-to-parallel converter for converting said "m"-bit parallel signal into a "n"-bit parallel signal, said parallel-to-parallel converter comprising:
        a common multiple register having a bit width which is a common multiple of "m" and "n";
        an input selector, connected to an input of said common multiple register, for writing said "m"-bit parallel signal into said common multiple register at a predetermined frequency; and
        an output selector, connected to an output of said common multiple register, for reading said "n"-bit1parallel signal from said common multiple register at a frequency equal to m/n times said predetermined frequency.

7. A parallel-to-parallel converter for converting an "m"-bit input signal having a predetermined frequency into an "n"-bit output signal having a frequency m/n times said predetermined frequency, one of "m" and "n" being the i-th power of 2(i=1,2, . . .),
    said converter including a common multiple register having a bit width which is a common multiple of said "m" and said "n".

8. A parallel-to-parallel converter comprising:
    a holding means constituted by a number of registers, the number being equal to a common multiple of "m" and "n";
    a write means for writing an "m"-bit input signal into said registers with an input frequency; and
    a read means for reading an "n"-bit output signal from said registers with a frequency equal to m/n times said input frequency.

9. The parallel-to-parallel converter as set forth in claim 8, further comprising a control means for controlling and differentiating a timing of writing said "m"-bit input signal into said registers and a timing reading said "n"-bit output signal from said registers.

10. The parallel-to-parallel converter as set forth in claim 8, where said write means comprises an input register and said read means comprises an output register, said parallel-to-parallel converter further comprising:
an "N"-frequency divider means for dividing an input frequency by "N",
output registers arranged at the output side of said holding means and an "M"-frequency divider means for dividing said input frequency by "M", where M/N is equal to m/n,
said write means being adapted to write data stored in said input register into said registers by means of an output signal of said "N"-frequency divider means,
said read means being adapted to read data stored in said registers to said output register by means of an output signal of said "M"-frequency divider means.

11. The parallel-to-parallel converter as set forth in claim 1 wherein m/n≠2 and n/m≠2.

12. The parallel-to-serial converter as set forth in claim 5 wherein m/n≠2 and n/m≠2.

13. The serial-to-parallel converter as set forth in claim 6 wherein m/n≠2 and n/m≠2.

14. The parallel-to-parallel converter as set forth in claim 7 wherein m/n≠2 and n/m≠2.

15. The parallel-to-parallel converter as set forth in claim 8 wherein m/n≠2 and n/m≠2.

* * * * *